US011588002B2

(12) United States Patent
Seol et al.

(10) Patent No.: US 11,588,002 B2
(45) Date of Patent: Feb. 21, 2023

(54) DISPLAY DEVICE INCLUDING COMMON POWER SUPPLY LINE

(71) Applicant: Samsung Display Co., Ltd., Yongin-Si (KR)

(72) Inventors: Younggug Seol, Yongin-si (KR); Dongyoon So, Yongin-si (KR); Jihyeon Ryu, Yongin-si (KR); Kyungmin Park, Yongin-si (KR)

(73) Assignee: Samsung Disolay Co., Ltd.

( * ) Notice: Subject to any disclaimer, the term of this patent is extended or adjusted under 35 U.S.C. 154(b) by 414 days.

(21) Appl. No.: 16/719,862

(22) Filed: Dec. 18, 2019

(65) Prior Publication Data

US 2020/0203463 A1 Jun. 25, 2020

(30) Foreign Application Priority Data

Dec. 21, 2018 (KR) .......................... 10-2018-0167897

(51) Int. Cl.
*H01L 27/32* (2006.01)
*G06F 3/044* (2006.01)
*H01L 51/52* (2006.01)

(52) U.S. Cl.
CPC .......... *H01L 27/3276* (2013.01); *G06F 3/044* (2013.01); *H01L 51/5246* (2013.01)

(58) Field of Classification Search
CPC ............. H01L 27/3276; H01L 51/5246; H01L 27/323; H01L 51/5237; H01L 51/5284; G06F 3/044
See application file for complete search history.

(56) References Cited

U.S. PATENT DOCUMENTS

| | | | |
|---|---|---|---|
| 9,577,215 B2 | 2/2017 | Hong | |
| 9,685,488 B2 | 6/2017 | Hong et al. | |
| 10,018,884 B2 | 7/2018 | Kim | |
| 10,361,223 B2 | 7/2019 | Kim et al. | |
| 2017/0338295 A1 | 11/2017 | Lee et al. | |
| 2018/0004051 A1* | 1/2018 | Kim | ..................... H01L 27/1244 |
| 2018/0039815 A1* | 2/2018 | Jung | .................. G06V 40/1306 |
| 2018/0284550 A1* | 10/2018 | Kim | ..................... H01L 27/0288 |

(Continued)

FOREIGN PATENT DOCUMENTS

| | | | | |
|---|---|---|---|---|
| CN | 107219660 A | * | 9/2017 | ......... G02F 1/13338 |
| KR | 10-2014-0019146 A | | 2/2014 | |
| KR | 10-2015-0099641 A | | 9/2015 | |

(Continued)

*Primary Examiner* — David D Davis
(74) *Attorney, Agent, or Firm* — Innovation Counsel LLP

(57) ABSTRACT

A display device may include a first substrate, a second substrate, a plurality of display elements, a sealing unit, and a common power supply line. The second substrate may overlap the first substrate. The display elements may be positioned between the first substrate and the second substrate. The sealing unit may surround the display elements in a plan view of the display device and may be arranged between the first substrate and the second substrate. The common power supply line may at least partially surround the display elements in the plan view of the display device and may include a protrusion. The protrusion may protrude beyond the sealing unit and may be positioned between the sealing unit and a first edge of the first substrate in the plan view of the display device.

19 Claims, 6 Drawing Sheets

(56) References Cited

U.S. PATENT DOCUMENTS

2019/0004638 A1\*  1/2019  Lee ..................... G06F 3/0443
2019/0179466 A1\*  6/2019  Kim ..................... G06F 3/0446

FOREIGN PATENT DOCUMENTS

| KR | 10-2015-0111022 A | 10/2015 |
| KR | 10-2016-0006861 A | 1/2016 |
| KR | 10-2017-0130016 A | 11/2017 |
| KR | 10-2018-0003661 A | 1/2018 |

\* cited by examiner

DISPLAY DEVICE INCLUDING COMMON POWER SUPPLY LINE

CROSS-REFERENCE TO RELATED APPLICATION

This application claims priority to and the benefit of Korean Patent Application No. 10-2018-0167897, filed on Dec. 21, 2018, in the Korean Intellectual Property Office; the disclosure of the Korean Patent Application is incorporated herein in its entirety by reference.

BACKGROUND

1. Field

The technical field relates to a display device.

2. Description of the Related Art

A display device may include a touch panel as an input unit for receiving user input. Electrostatic discharge may cause a defect in the touch panel.

SUMMARY

One or more embodiments may be related a display device that may be protected against a potential defect.

According to one or more embodiments, a display device includes the following elements: a substrate including a display area, a peripheral area around the display area, and a pad area arranged in the peripheral area; an encapsulation substrate over the substrate; a sealing unit surrounding the display area and arranged between the substrate and the encapsulation substrate; and a common power supply line in the peripheral area and partially surrounding the display area, wherein the pad area is arranged over one edge of the substrate, the common power supply line extends along edges of the substrate except for the one edge over which the pad area is arranged, the sealing unit includes a first area located between the pad area and the display area, and the common power supply line includes an extension area protruding to the outside of the first area.

The display device may further include: a blocking pattern arranged on a top surface of the encapsulation substrate and corresponding to an outer surface of the first area, the blocking pattern having conductivity, wherein the extension area may cover an end of the blocking pattern.

The extension area may include at least one pointed portion.

The extension area may include a plurality of pointed portions arranged around the end of the blocking pattern.

The sealing unit may include: a second area parallel to the first area, and a third area and a fourth area connecting the first area and the second area, the third area and the fourth being parallel to each other, wherein the second area, the third area, and the fourth area may cover an outer end of the common power supply line.

Outer surfaces of the second area, the third area, and the fourth area may be located on the same plane as an outer surface of the encapsulation substrate and an outer surface of the substrate.

The first area may be spaced apart toward the display area from an end of the encapsulation substrate.

The display device may further include: a pair of blocking patterns respectively corresponding to an outer surface and an inner surface of the first area, the pair of blocking patterns being arranged on a top surface of the encapsulation substrate; and an input sensing unit corresponding to the display area, wherein an end of the extension area may be located, in a plan view, at a further outer side than an end of one of the pair of blocking patterns that corresponds to the outer surface of the first area.

A display element may be located in the display area, the display element including a pixel electrode, a common electrode, and an intermediate layer, wherein the intermediate layer includes an emission layer between the pixel electrode and the common electrode, and the common power supply line is electrically connected to the common electrode.

A driving power supply line configured to supply driving power to the display element may be between the display area and the first area.

According to one or more embodiments, a display device includes: a substrate including a display area, a peripheral area around the display area, and a pad area arranged in the peripheral area; an encapsulation substrate located over the substrate and having an area less than that of the substrate; an input sensing unit on the encapsulation substrate; a common power supply line in the peripheral area partially surrounding the display area; and a sealing unit surrounding the display area and arranged between the substrate and the encapsulation substrate, wherein the pad area is arranged over one edge of the substrate, the sealing unit includes a first area located between the pad area and the display area, a blocking pattern is arranged over the encapsulation substrate, corresponds to an outer surface of the first area, and has conductivity, the common power supply line includes an extension area overlapping an end of the blocking pattern, and an end of the extension area is located at a further outer side than the end of the blocking pattern.

The extension area may protrude to the outside of the first area.

The extension area may cover the end of the blocking pattern in a plan view.

The extension area may include at least one pointed portion.

The extension area may include a plurality of pointed portions arranged around the end of the blocking pattern.

The common power supply line may extend along edges of the substrate except for the one edge over which the pad area is arranged, and the sealing unit may include: a second area parallel to the first area, and a third area and a fourth area connecting the first area and the second area, the third area and the fourth being parallel to each other, wherein the second area, the third area, and the fourth area may cover an outer end of the common power supply line.

The first area may be spaced apart toward the display area from an end of the encapsulation substrate.

Outer surfaces of the second area, the third area, and the fourth area may be located on the same plane as an outer surface of the encapsulation substrate and an outer surface of the substrate.

A display element may be located in the display area, the display element including a pixel electrode, a common electrode, and an intermediate layer, wherein the intermediate layer includes an emission layer between the pixel electrode and the common electrode, and the common power supply line is electrically connected to the common electrode.

A driving power supply line configured to supply driving power to the display element may be located between the display area and the first area.

An embodiment may be related to a display device. The display device may include a first substrate, a second substrate, a plurality of display elements, a sealing unit, and a common power supply line. The second substrate may overlap the first substrate. The display elements may be positioned between the first substrate and the second substrate. The sealing unit may surround the display elements in a plan view of the display device and may be arranged between the first substrate and the second substrate. The common power supply line may be electrically connected to the display elements, may at least partially surround the display elements in the plan view of the display device, and may include a protrusion. The protrusion may protrude beyond the sealing unit and may be positioned between the sealing unit and a first edge of the first substrate in the plan view of the display device.

The display device may include a conductive member positioned beyond the sealing unit in the plan view of the display device, arranged on the second substrate, formed of an electrically conductive material, and partially overlapping the protrusion.

The protrusion may include two edges that are oriented at an acute angle relative to each other in the plan view of the display device and are positioned farther from the sealing unit than the conductive member in the plan view of the display device.

The protrusion may include a first pointed portion and a second pointed portion. An edge of the conductive member may be positioned between the first pointed portion and the second pointed portion in a direction parallel to the first edge of the first substrate in the plan view of the display device.

The sealing unit may include a first section and a second section. The protrusion may abut the first section in the plan view of the display device. The second section may be opposite the first area, may cover a covered portion of the common power supply line, and may expose an exposed portion of the common power supply line. The exposed portion of the common power supply line may be positioned between the covered portion of the common power supply line and the first section of the sealing unit in the plan view of the display device.

A face of the second section of the sealing unit may be coplanar with each of a face of the second substrate and a face of the substrate.

The protrusion of the common power supply line may be positioned between the first section of the sealing unit and an edge of the second substrate in the plan view of the display device.

The display device may include a first conductive member, a second conductive member, and an input sensing unit. The first conductive member may be positioned on the second substrate and may overlap the protrusion of the common power supply line. The second conductive member may be positioned on the second substrate. A first section of the sealing unit may be positioned between the first conductive member and the second conductive member and may abut the protrusion of the common power supply line in the plan view of the display device. The input sensing unit may overlap the display elements.

The displaying elements may include a display element. The display element may include a pixel electrode, a common electrode, and an intermediate layer. The intermediate layer may include an emission layer between the pixel electrode and the common electrode. The common power supply line may be electrically connected to the common electrode.

The display device a driving power supply line configured to supply driving power to the display element. A first section of the driving power supply line may be positioned between the display element and a first section of the sealing unit. The protrusion of the common power supply line may protrude from and abut the first section of the sealing unit in the plan view of the display device.

A second section of the driving power supply line may be positioned closer to the first edge of the first substrate than the protrusion of the common power supply line.

The display device may include the following elements: an input sensing unit positioned on the second substrate; and a conductive member positioned on the second substrate and partially overlapping the protrusion of the common power supply line. A first section of the sealing unit may be positioned between the conductive and the input sensing unit. A conductive material of the conductive member may be identical to a conductive material of a wiring set of the input sensing unit.

The conductive member may be positioned between the first section of the sealing unit and the first edge of the first substrate. A second section of the sealing unit may extend not aligned with the first section of sealing unit in the plan view of the display device. A face of the second section of the sealing unit may be coplanar with a face of the first substrate.

The second section of the sealing unit may cover a covered portion of the common power supply line and may expose an exposed portion of the common power supply line. The covered portion of the common power supply line may be positioned between the exposed portion of the common power supply line and the face of the second section of the sealing unit.

The display device may include a conductive member formed of a conductive material, positioned directly on a face of the second substrate, partially overlapping the protrusion, and narrower than the protrusion in a direction perpendicular to the first edge of the first substrate.

The display device may include an input sensing unit positioned directly on the face of the second substrate.

The display device may include a conductive terminal positioned at the first edge of the first substrate. The common power supply line may include a connecting portion directly connected to the conductive terminal, and narrower than the protrusion in a direction parallel to the first edge of the first substrate.

A first face of the sealing unit may be positioned between the protrusion and a second face of the sealing unit. The second face of the sealing unit may be coplanar with a face of the first substrate.

The protrusion may include a first portion and a second portion narrower than the first portion in the direction perpendicular to the first edge of the first substrate. The conductive member may be narrower than each of the first portion and the second portion in the direction perpendicular to the first edge of the first substrate.

The protrusion may be positioned between a first edge of the second substrate and the sealing unit in the plan view of the display device. The first edge of the second substrate may be positioned between the first edge of the first substrate and the protrusion in the plan view of the display device.

DETAILED DESCRIPTION

Figure 1:
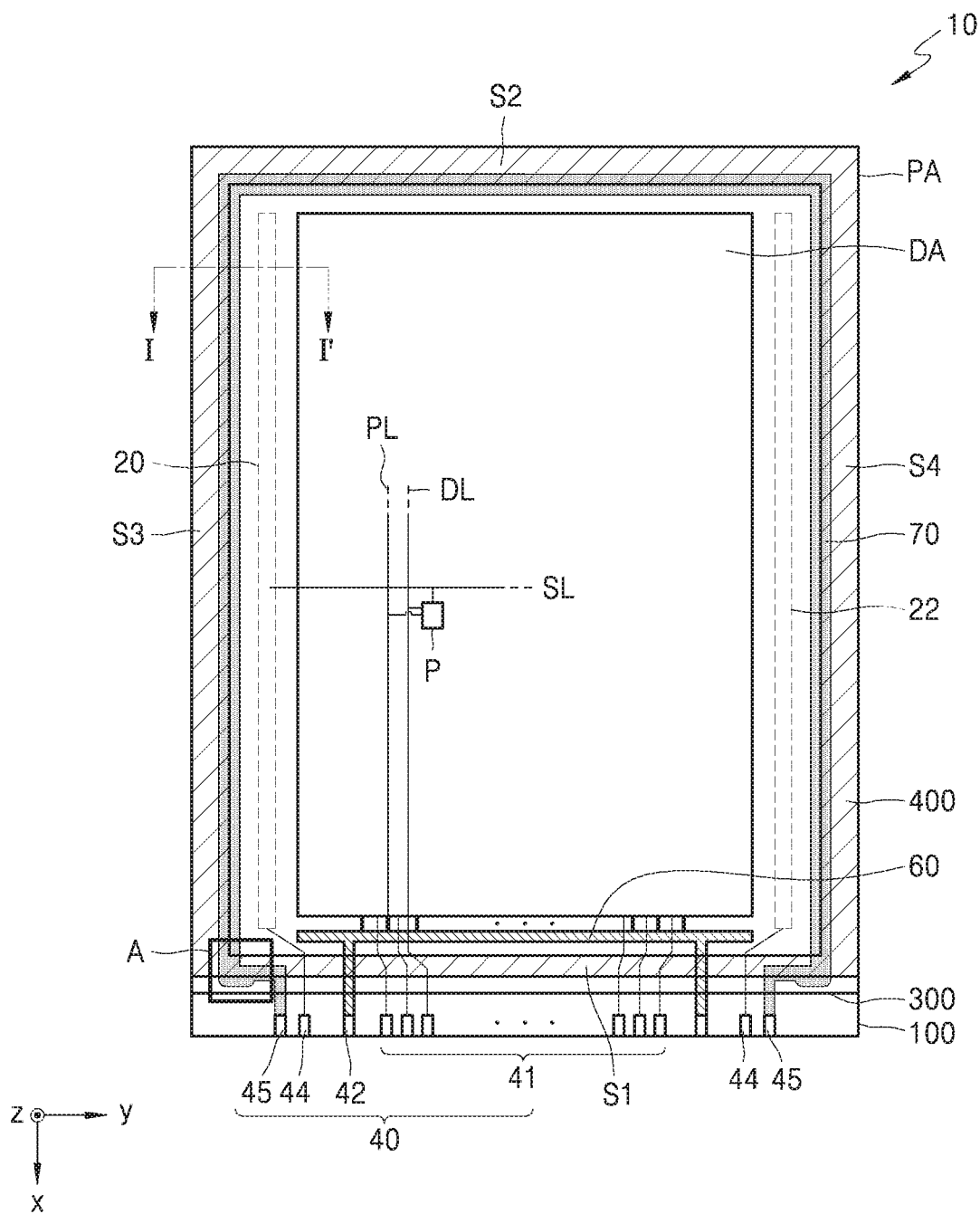
FIG. 1 is a plan view of a display device according to an embodiment.

Example embodiments are described with reference to the drawings. Practical embodiments may be embodied in many different forms and should not be construed as limited to the example embodiments.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

The singular forms "a", "an" and "the" may include the plural forms as well, unless the context clearly indicates otherwise.

The terms "comprises/includes" and/or "comprising/including" may specify the presence of stated features or components, but do not preclude the presence or addition of one or more other features or components.

When a first element is referred to as being "on" a second element, the first element can be directly or indirectly on the second element, and one or more intervening elements may be present between the first element and the second element.

Sizes of elements in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

In the drawings, like reference numerals may be given to like or corresponding elements.

The term "extension area" may mean "protrusion." The noun "pattern" may mean "member." The term "conductive" may mean "electrically conductive." The term "conductivity" may mean "electrical conductivity." The term "area" may mean "portion" or "section." The term "pixel" may mean "pixel", "sub-pixel," or "display element." The term "connect" may mean "electrically connect." The term "insulate" may mean "electrically insulate." The term "surface" may mean "face." The term "end" may mean "edge."

Figure 2:
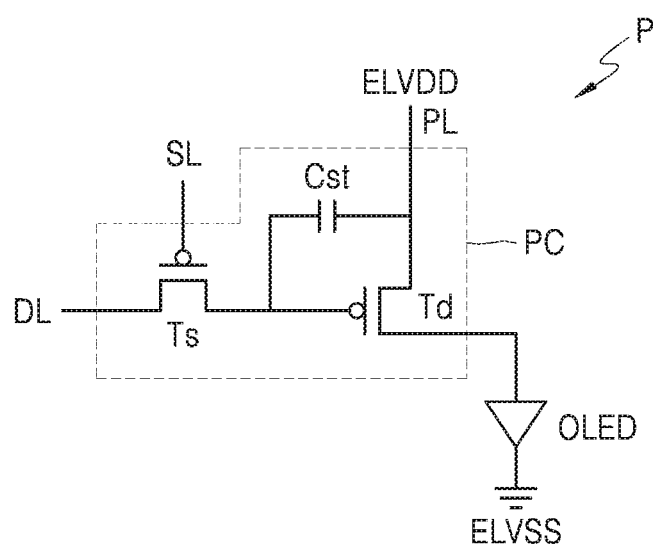
FIG. 2 is an equivalent circuit diagram of a sub-pixel or pixel of a display device according to an embodiment.

FIG. 1 is a plan view of a display device 10 according to an embodiment, and FIG. 2 is an equivalent circuit diagram of a sub-pixel or a pixel of the display device 10 according to an embodiment.

Referring to FIG. 1, the display device 10 includes a display area DA with display elements for displaying an image and includes a peripheral area PA around the display area DA. A substrate 100 includes a corresponding display area DA and a corresponding peripheral area PA.

Pixels P are located in the display area DA. A pixel P may be connected to a scan line SL extending in a y-direction and may be connected a data line DL extending in an x-direction and intersecting with the scan line SL. Each of the pixels P may include a display element for emitting red, green, blue, or white light. Each of the pixels P may include an organic light-emitting diode as a display element.

Referring to FIG. 2, one pixel P may include a pixel circuit PC and an organic light-emitting diode OLED connected to the pixel circuit PC, the pixel circuit PC being connected to a scan line SL and a data line DL.

The pixel circuit PC may include a driving thin film transistor Td, a switching thin film transistor Ts, and a storage capacitor Cst. The switching thin film transistor Ts may be connected to a scan line SL and a data line DL and transfer a data signal input through the data line DL to the driving thin film transistor Td in response to a scan signal input through the scan line SL.

The storage capacitor Cst may be connected to the switching thin film transistor Ts and a driving voltage supply line PL and may store a voltage corresponding to a difference between a voltage transferred from the switching thin film transistor Ts and a driving voltage ELVDD supplied to the driving voltage supply line PL.

The driving thin film transistor Td may be connected to the driving voltage supply line PL and the storage capacitor Cst and may control a driving current flowing through the organic light-emitting diode OLED from the driving voltage supply line PL in response to the voltage value stored in the storage capacitor Cst. The organic light-emitting diode OLED may emit light having predetermined brightness by using the driving current. The organic light-emitting diode OLED may emit, for example, red, green, blue, or white light.

FIG. 2 shows that one pixel P includes two thin film transistors, that is, the switching thin film transistor Ts and the driving thin film transistor Td, and one storage capacitor Cst. In an embodiment, the pixel circuit PC of the pixel P may include three or more thin film transistors or two or more storage capacitors.

Referring to FIG. 1 again, the peripheral area PA may surround the display area DA. The peripheral area PA does not include pixels P and is a non-display area that does not dynamically provide images. Drivers 20 and 22, a pad area 40, a driving power supply line 60, a common power supply line 70, etc. may be arranged in the peripheral area PA.

The drivers 20 and 22 may include an emission driving circuit, a scan driving circuit, etc. The emission driving circuit is arranged in the peripheral area PA of the substrate 100 and generates and transfers an emission control signal to each pixel P through an emission control line (not shown). The emission driving circuit may be arranged on the left and the right of the display area DA. In an embodiment, only one emission driving circuit may be provided. The scan driving circuit is arranged in the peripheral area PA of the substrate 100 and generates and transfers a scan signal to each pixel P through a scan line SL. The scan driving circuit may be arranged on the left and the right of the display area DA. In an embodiment, only one scan driving circuit may be provided.

The pad area 40 may include various kinds of electronic elements and/or a printed circuit board, is arranged on an edge of the substrate 100, and includes a plurality of terminals 41, 42, 44, and 45. The pad area 40 may be arranged in the peripheral area PA immediately neighboring one side of the display area DA, may be exposed by an insulating layer, and may be electrically connected to a flexible printed circuit board, which may support a data driving circuit. The pad area 40 may extend not parallel to either of the drivers 20 and 22.

The driving power supply line 60 may be arranged in the peripheral area PA. The driving power supply line 60 may be arranged between the pad area 40 and one side of the display area DA that is adjacent to the pad area 40 and may be arranged between the display area DA and a first area S1 of a sealing unit 400. The driving power ELVDD provided through the terminals 42 may be supplied to each of pixels P through the driving voltage line PL.

The common power supply line 70 may be arranged in the peripheral area PA and may at least partially surround the display area DA. The common power supply line 70 may have an opening loop adjacent to the pad area 40 and may extend along edges of the substrate 100. The common power supply line 70 is connected to the terminals 45 and provides common power ELVSS to a common electrode of the organic light-emitting diode OLED of a pixel P.

An encapsulation substrate 300 may be located over the substrate 100, and the sealing unit 400 may be arranged between the substrate 100 and the encapsulation substrate 300 and may bond the substrate 100 to the encapsulation substrate 300. The encapsulation substrate 300 may be smaller than the substrate 100. The pad area 40 may not be covered by the encapsulation substrate 300.

The sealing unit 400 may include an inorganic material such as frit. In an embodiment, the sealing unit 400 may include epoxy, etc. The sealing unit 400 may surround the display area DA in a plan view as shown in FIG. 1. Accordingly, a space defined by the substrate 100, the encapsulation substrate 300, and the sealing unit 400 may be enclosed against external moisture or impurities.

The display area DA may be substantially rectangular, and the sealing unit 400 may include the first area S1 near one edge of the encapsulation substrate 300, a second area S2 parallel to the first area S1, and a third area S3 and a fourth area S4 each connecting the first area S1 and the second area S2. The first area S3 and the fourth area S4 may be parallel to each other. Corner portions of the sealing unit 400 at which the first area S1 is connected to the third area S3 and the fourth area S4, and corner portions of the sealing unit 400 at which the second area S2 is connected to the third area S3 and the fourth area S4 may be rounded.

The first area S1 may be arranged between the display area DA and the pad area 40. The first area S1 is positioned between the display area DA and an end/edge of the encapsulation substrate 300. Each of the second area S2, the third area S3, and the fourth area S4 has an edge that overlaps an end/edge of the encapsulation substrate 300. Outer surfaces of the second area S2, the third area S3, and the fourth area S4 may be respectively coplanar with corresponding outer surfaces of the encapsulation substrate 300, and the encapsulation substrate 300 does not protrude beyond the second area S2, the third area S3, and the fourth area S4. Therefore, an unutilized space of the display device 10 may be minimized. The second area S2, the third area S3, and the fourth area S4 may cover outer ends/edges of the common power supply line 70 and may cover at least a portion of the common power supply line 70. With this structure, the utilized space of the display device 10 may be minimized.

An input sensing unit (e.g., the unit 500 shown in FIG. 3) may be located on the encapsulation substrate 300. The input sensing unit may generate an input signal based on a touch of an external touch input unit such as a user's hand or a pen. The input sensing unit may be directly formed on a top surface of the encapsulation substrate 300. The input sensing unit may include a capacitance-type input sensing unit in which a change in a capacitance occurs due to a touch. If external electrostatic discharge ESD is introduced, a defect may be generated in the capacitance-type input sensing unit. According to an embodiment, to prevent external electrostatic discharge ESD from being introduced to the input sensing unit, the common power supply line 70 includes an extension area protruding beyond the first area S1. Because of the extension area, electrostatic discharge introduced to the display device 10 may be induced to the common power supply line 70, such that the electrostatic discharge may not significantly affect the input sensing unit.

Figure 3:
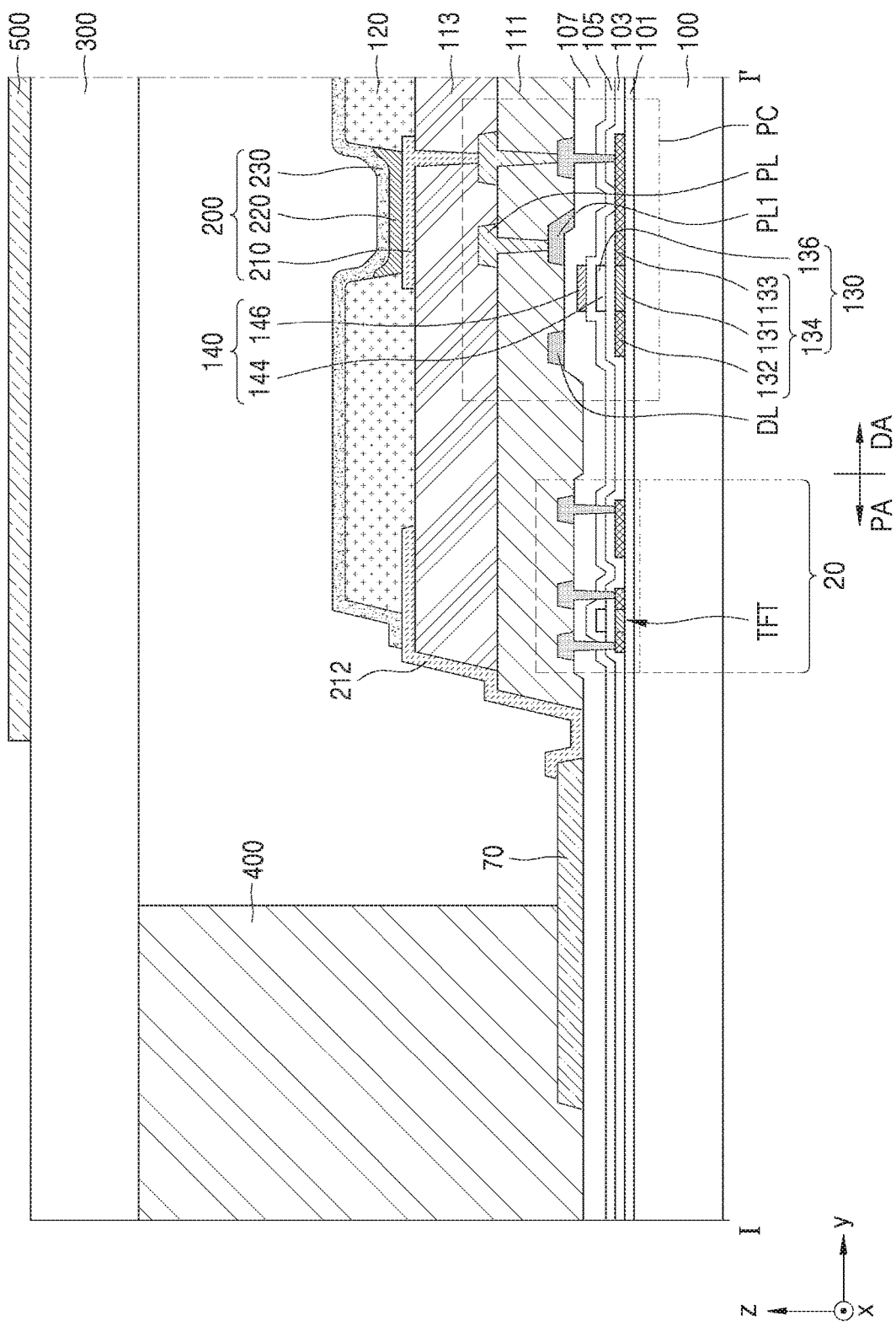
FIG. 3 is a cross-sectional view of an example taken along line I-I' of FIG. 1 according to an embodiment.

FIG. 3 is a cross-sectional view taken along line I-I' of FIG. 1 according to an embodiment.

Referring to FIG. 3, the pixel circuit PC and a display element 200 may be located in the display area DA over the substrate 100. The driver 20, the common power supply line 70, etc. may be arranged in the peripheral area PA over the substrate 100.

The substrate 100 may include at least one of a glass material, a metal material, or a plastic material including polyethylene terephthalate (PET), polyethylene naphthalate (PEN), polyimide, etc. The encapsulation substrate 300 may include a transparent material. For example, the encapsulation substrate 300 may include a glass material or a plastic material including at least one of polyethylene terephthalate (PET), polyethylene naphthalate (PEN), polyimide, etc. The substrate 100 and the encapsulation substrate 300 may include the same material or different materials.

A buffer layer 101 may be formed on the substrate 100. The buffer layer 101 may block foreign substance or moisture penetrating through the substrate 100. The buffer layer 101 may include an inorganic material such as SiOx, SiNx, and/or SiON and may include a single layer or a multi-layer structure. The buffer layer 101 may be formed in the display area DA and the peripheral area PA.

A thin film transistor 130, a storage capacitor 140, and the display element 200 electrically connected to the thin film transistor 130 and the storage capacitor Cst may be located in the display area DA over the substrate 100. The display element 200 may include, for example, an organic light-emitting diode OLED. The thin film transistor 130 of FIG. 3 may correspond to the driving thin film transistor Td (described with reference to FIG. 2, and the storage capacitor 140 may correspond to the storage capacitor Cst described with reference to FIG. 2.

The thin film transistor 130 includes a semiconductor layer 134 and a gate electrode 136. The semiconductor layer 134 may include polycrystalline silicon. The semiconductor layer 134 may include a channel region 131 overlapping the gate electrode 136, and may include a source region 132 and a drain region 133 respectively arranged on two opposite sides of the channel region 131 and doped with impurities having higher concentration than that of the channel region 131. The impurities may include N-type impurities or P-type impurities. In an embodiment, the semiconductor layer 134 may include amorphous silicon or an organic semiconductor material. In an embodiment, the semiconductor layer 134 may include an oxide semiconductor.

As described above with reference to FIG. 2, the pixel circuit PC may further include the switching thin film transistor Ts. The semiconductor layer 134 of the thin film transistor 130 and a semiconductor layer of the switching thin film transistor Ts (see FIG. 2) may respectively include different materials. For example, one of the semiconductor layer 134 of the thin film transistor 130 and the semiconductor layer of the switching thin film transistor Ts (see FIG. 2) may include an oxide semiconductor, and the other may include polycrystalline silicon.

A gate insulating layer 103 may be arranged between the semiconductor layer 134 and the gate electrode 136. The gate insulating layer 103 may include an inorganic insulating layer including SiON, SiOx, and/or SiNx, and may include a single layer or a multi-layer structure.

The storage capacitor 140 includes a lower electrode 144 and an upper electrode 146 overlapping each other. A first interlayer insulating layer 105 may be arranged between the lower electrode 144 and the upper electrode 146.

The first interlayer insulating layer 105 may have a predetermined dielectric constant, may include an inorganic insulating layer including SiON, SiOx, and/or SiNx, and may include a single layer or a multi-layer structure. FIG. 3 shows that the storage capacitor 140 overlaps the thin film transistor 130, and that the lower electrode 144 serves as the gate electrode 136 of the thin film transistor 130. In an embodiment, the lower electrode 144 may include a separate element that is independent of the gate electrode 136 of the thin film transistor 130.

The storage capacitor 140 may be covered by a second interlayer insulating layer 107. The second interlayer insulating layer 107 may include an inorganic insulating layer including SiON, SiOx, and/or SiNx, and may include a single layer or a multi-layer structure.

The driving voltage line PL may be arranged on a first organic insulating layer 111. The driving voltage line PL may include at least one of Al, Cu, Ti, etc. and may include a single layer or a multi-layer structure. In an embodiment, the driving voltage line PL may have a multi-structure of Ti—Al—Ti.

FIG. 3 shows that a lower driving voltage line PL1 is arranged under the first organic insulating layer 111. The lower driving voltage line PL1 may be electrically connected to the driving voltage line PL through a contact hole passing through the first organic insulating layer 111 and may prevent a voltage drop of the driving voltage ELVDD provided through the driving voltage line PL. The lower driving voltage line PL1 may include the same material as that of the data line DL. The lower driving voltage line PL1 and the data line DL may include at least one of Al, Cu, Ti, etc. and may include a single layer or a multi-layer structure. In an embodiment, the lower driving voltage line PL1 and the data line DL may have a multi-structure of Ti—Al—Ti or TIN—Al—Ti.

The first organic insulating layer 111 includes an organic insulating material. The organic insulating material may include an imide-based polymer, a general-purpose polymer such as polymethylmethacrylate (PMMA) or polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend of some of the above materials. In an embodiment, the first organic insulating layer 111 may include polyimide.

The driving voltage line PL may be covered by a second organic insulating layer 113. The second organic insulating layer 113 may include an imide-based polymer, a general-purpose polymer such as polymethylmethacrylate (PMMA) or polystyrene (PS), polymer derivatives having a phenol-based group, an acryl-based polymer, an aryl ether-based polymer, an amide-based polymer, a fluorine-based polymer, a p-xylene-based polymer, a vinyl alcohol-based polymer, or a blend. In an embodiment, the second organic insulating layer 113 may include polyimide.

A pixel electrode 210 is arranged on the second organic insulating layer 113. A pixel-defining layer 120 is arranged on the pixel electrode 210. The pixel-defining layer 120 may define an opening that exposes at least a central portion of the pixel electrode 210. The pixel-defining layer 120 may prevent an arc between the pixel electrode 210 and the common electrode 230 by increasing a distance between an edge of the pixel electrode 210 and the common electrode 230. The pixel-defining layer 120 may include, for example, an organic material such as polyimide or hexamethyldisiloxane (HMDSO).

The intermediate layer 220 may include a low molecular weight or polymer material. When the intermediate layer 220 includes a low molecular weight material, the intermediate layer 220 may have a structure in which a hole injection layer (HIL), a hole transport layer (HTL), an emission layer (EML), an electron transport layer (ETL), an electron injection layer (EIL), etc. are stacked. The intermediate layer 220 may include one or more organic materials such as at least one of copper phthalocyanine (CuPc), N,N'-Di(naphthalene-1-yl)-N,N'-diphenyl-benzidine (NPB), and tris-8-hydroxyquinoline aluminum (Alq3). These layers may be formed by vacuum deposition.

When the intermediate layer 220 includes a polymer material, the intermediate layer 220 may have a structure including an HTL and an EML. In this case, the HTL may include PEDOT, and the EML may include a polymer material such as polyphenylene vinylene (PPV)-based material and/or a polyfluorene-based material. In an embodiment, at least one of layers constituting the intermediate layer 220 may be formed as one body over a plurality of pixel electrodes 210. In an embodiment, the intermediate layer 220 may include a patterned layer corresponding to each of the plurality of pixel electrodes 210.

The common electrode 230 may be arranged in the display area DA and may cover the display area DA. The common electrode 230 may cover a plurality of pixels.

A filling material (not shown) may be arranged between the common electrode 230 and the encapsulation substrate 300. The filling material (not shown) may include at least one of a light-curable epoxy-based material and an acrylate-based material.

The driver 20, the common power supply line 70, etc. may be arranged in the peripheral area PA of the substrate 100.

The driver 20 may include thin film transistors TFT and wiring (not shown) connected to the thin film transistors TFT. The thin film transistors TFT and the thin film transistor 130 of the pixel circuit PC may be formed in a same process.

The common power supply line 70 may include the same material as that of the driving voltage line PL. The common power supply line 70 may have a multi-structure of Ti—Al—Ti. An outer end of the common power supply line 70 may be covered by the sealing unit 400, and an inner end, which is opposite to the outer end, may directly contact a conductive layer 212. The conductive layer 212 may include the same material as that of the pixel electrode 210. The conductive layer 212 may be connected to the common electrode 230. In an embodiment, the common power supply line 70 may extend to the display area DA and may directly contact the common electrode 230.

The sealing unit 400 bonds the substrate 100 to the encapsulation substrate 300. The sealing unit 400 may include frit or epoxy. Frit may have $SiO_2$ as a main material and may include a laser or infrared absorption material, an organic binder, a filler for reducing a thermal expansion coefficient, etc. While the frit undergoes drying and plastic processes, an organic binder and moisture may be removed. A laser or infrared absorption material may include a transition metal compound. Frit may be cured by a laser to form the sealing unit 400.

The sealing unit 400 may cover the outer end of the common power supply line 70, overlap a portion of the common power supply line 70, directly contact the common power supply line 70, and not spaced from the common power supply line 70. Advantageously, an unutilized space of the display device 10 (see FIG. 1) may be minimized.

An input sensing unit 500 may be located on the encapsulation substrate 300. The input sensing unit 500 may be directly formed on the encapsulation substrate 300. The input sensing unit 500 may include a capacitance-type input sensing unit in which a change in a capacitance occurs due to a touch. The input sensing unit 500 includes a plurality of sensing patterns that form a capacitor in cooperation with the common electrode 230. When an external touch input unit touches the input sensing unit 500, the external touch input unit and the plurality of sensing patterns form another capacitor. Since the two capacitors are connected in series by a touch operation, a change in a capacitance occurs, and a touch panel function may be implemented by sensing a location of the change in the capacitance and a magnitude of the change.

Figure 4:
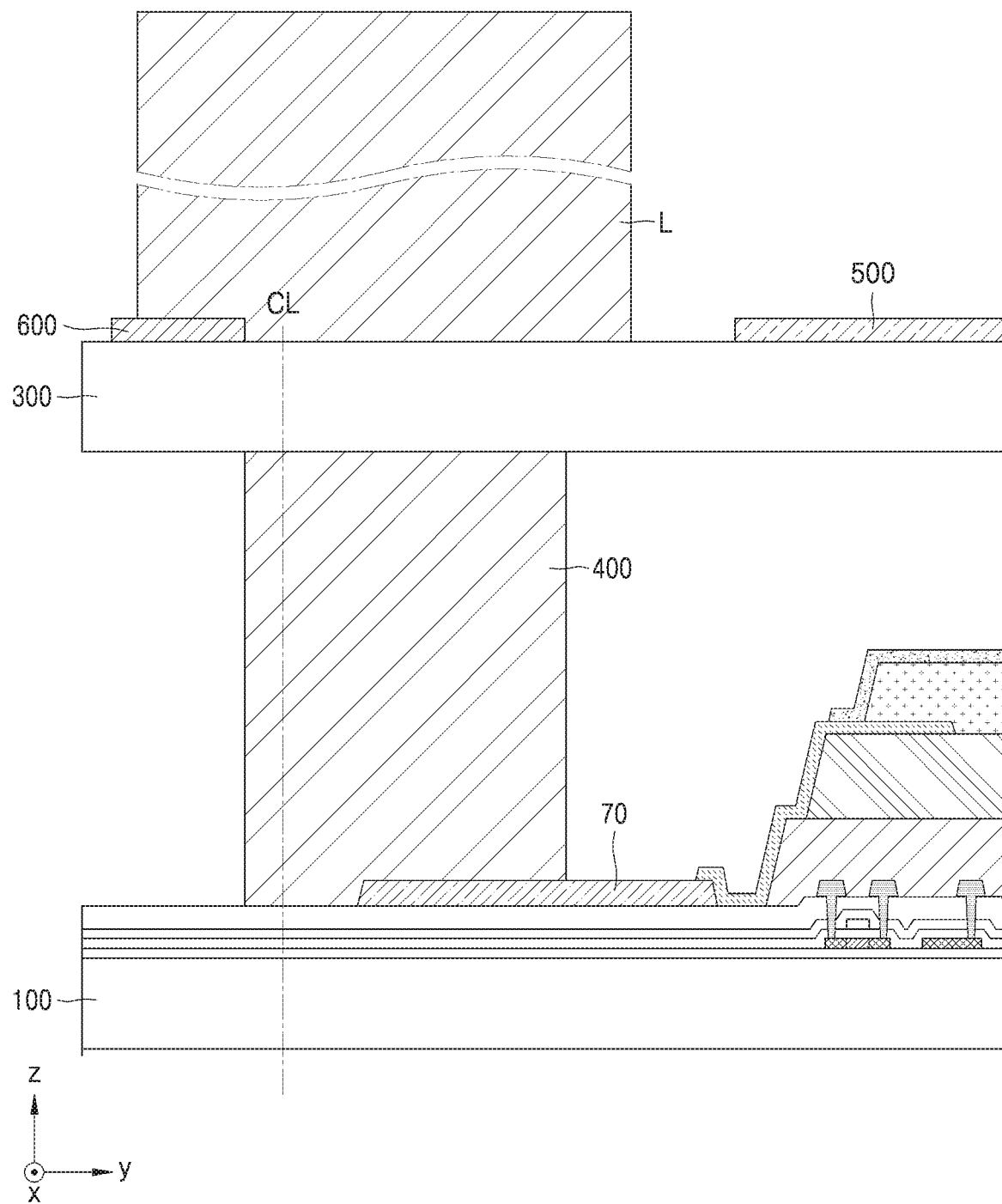
FIG. 4 is a cross-sectional view of a structure formed in a method of manufacturing a display device of FIG. 1 according to an embodiment.
Figure 5:
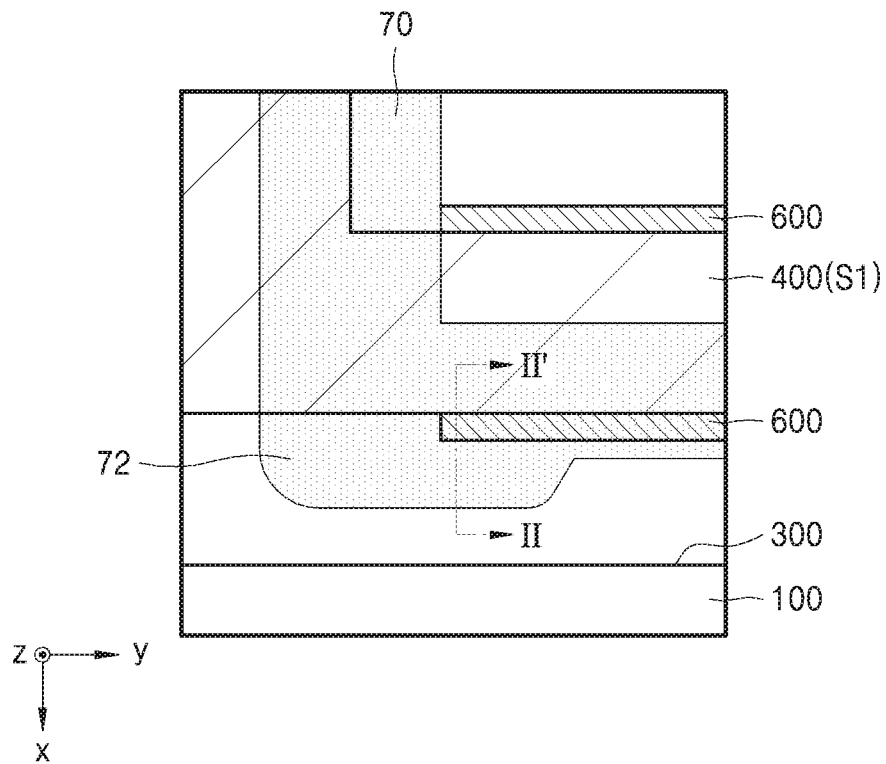
FIG. 5 is a plan view of a region A of FIG. 1 according to an embodiment.
Figure 6:
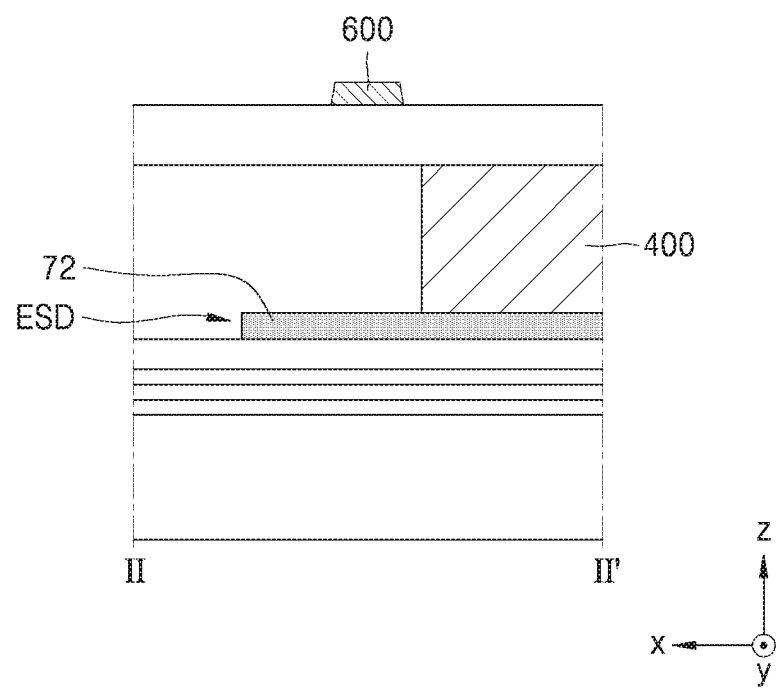
FIG. 6 is a cross-sectional view taken along line II-II' of FIG. 5 according to an embodiment.

FIG. 4 is a cross-sectional view of a structure formed in a method of manufacturing the display device 10 of FIG. 1 according to an embodiment, FIG. 5 is a plan view of a region A of FIG. 1 according to an embodiment, and FIG. 6 is a cross-sectional view of an example taken along line II-II' of FIG. 5 according to an embodiment.

FIG. 4 shows an operation of curing the sealing unit 400 to bond the substrate 100 to the encapsulation substrate 300. The curing of the sealing unit 400 may be performed by irradiating a laser beam L toward the encapsulation substrate 300. A blocking pattern 600 may be formed on a top surface of the encapsulation substrate 300. The blocking pattern 600 may include the same material as that of a set of wiring of the input sensing unit 500. The blocking pattern 600 may control a range of the sealing unit 400 that is cured by partially blocking an irradiated laser beam L.

After the sealing unit 400 is cured, the substrate 100, the sealing unit 400, and the encapsulation substrate 300 may be substantially simultaneously cut along a cutting line CL. Since the second area S2 (see FIG. 1), the third area S3 (see FIG. 1), and the fourth area S4 (see FIG. 1) of the sealing unit 400 are substantially simultaneously cut together with the substrate 100 and the encapsulation substrate 300 along three corresponding planes, outer faces of the second area S2 (see FIG. 1), the third area S3 (see FIG. 1), and the fourth area S4 (see FIG. 1) of the sealing unit 400 may be located on the same planes as an outer faces of the encapsulation substrate 300 and outer faces of the substrate 100. A width of the sealing unit 400 may be reduced. Since the second area S2 (see FIG. 1), the third area S3 (see FIG. 1), and the fourth area S4 (see FIG. 1) of the sealing unit 400 cover outer ends/edges of the common power supply line 70 and overlap a portion of the common power supply line 70, an unutilized space of the display device 10 (see FIG. 1) may be minimized.

Wires are arranged between the pad area 40 (see FIG. 1) and the display area DA (see FIG. 1). Therefore, the substrate 100, the sealing unit 400, and the encapsulation substrate 300 are not cut at the pad area 40. As a result, as shown in FIG. 5, the first area S1 of the sealing unit 400 is spaced from an end/edge of the encapsulation substrate 300 and is positioned between the display area DA and the end/edge of the encapsulation substrate 300. The blocking pattern 600 may limit a width of the first area S1. Since wires are arranged between the pad area 40 (see FIG. 1) and the display area DA (see FIG. 1), when the laser beam L (see FIG. 4) is irradiated to cure the sealing unit 400, the curing may be influenced by the wires. To more precisely control the width of the first area S1 that is cured, a pair of blocking patterns 600 corresponding to an inner face and an outer face of the first area S1 may be formed on the encapsulation substrate 300.

Since the blocking pattern 600 includes the same material as a conductive material of the input sensing unit 500 and is located substantially close to the input sensing unit 500, the blocking pattern 600 in the display device 10 (see FIG. 1) may introduce electrostatic discharge to the input sensing unit 500.

To prevent this electrostatic discharge from affecting the input sensing unit 500, the common power supply line 70 includes an extension area 72 protruding beyond the first area S1. The extension area 72 may overlap an end of the blocking pattern 600 outside the first area S1. The extension area 72 may cover the end/edge of the blocking pattern 600. As shown in FIG. 6, an end/edge of the extension area 72 is located farther from the sealing unit 400 than an end/edge of the blocking pattern 600. With this structure, external electrostatic discharge may be induced to the extension area 72 and may not significantly affect the input sensing unit 500. Since electrostatic discharge induced to the extension area 72 is widely diffused, the electrostatic discharge may not significantly influence the display device 10 (see FIG. 1).

Figure 7:
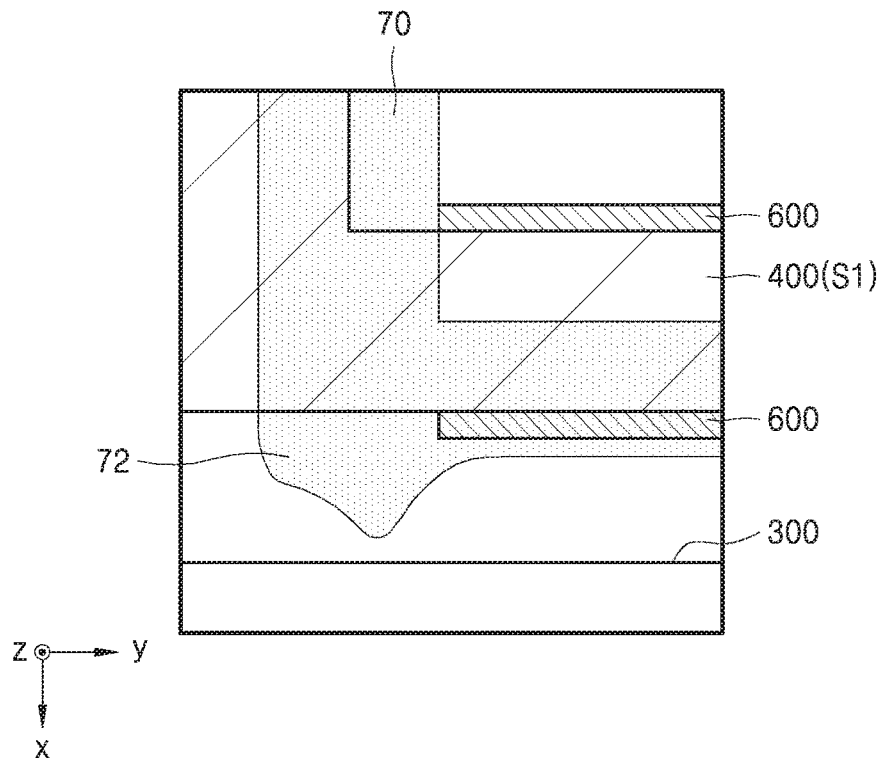
FIG. 7 is a plan view of a region A of FIG. 1 according to an embodiment.
Figure 8:
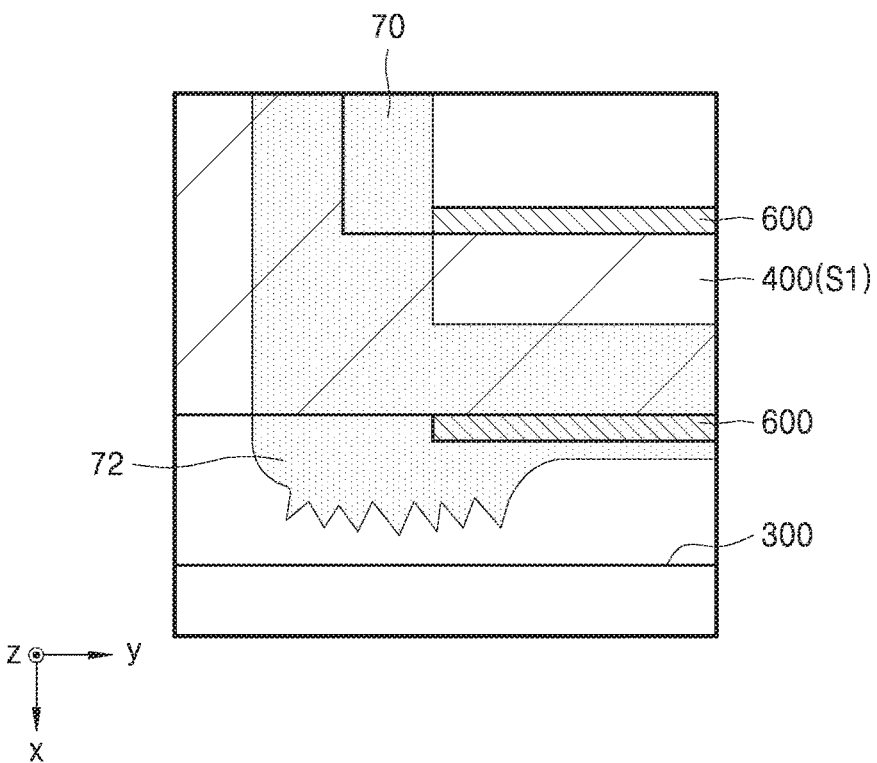
FIG. 8 is a plan view of a region A of FIG. 1 according to an embodiment.

Each of FIGS. 7 and 8 is a plan view of a region A of FIG. 1 according to an embodiment. Description of above-described elements may not be repeated.

Referring to FIGS. 7 and 8, the common power supply line 70 includes the extension area 72 protruding beyond the first area S1 of the sealing unit 400. The extension area 72 covers an end of the blocking pattern 600 outside the first area S1. Therefore, external electrostatic discharge is induced to the extension area 72 and may not significantly affect the input sensing unit 500.

As shown in FIG. 7, the extension area 72 may include at least one pointed portion. Since the pointed structure serves as a lightning rod, electrostatic discharge may be more effectively induced to the extension area 72.

FIG. 8 shows that the extension area 72 includes a plurality of pointed portions so as to more effectively induce electrostatic discharge. The plurality of pointed portions may substantially surround an end of the blocking pattern 600 and thus may effectively prevent introduction of electrostatic discharge into the blocking pattern 600.

in embodiments, the extension area 72 may have one or more other shapes, such as a needle shape and/or a sawtooth shape, so as to effectively induce electrostatic discharge.

According to embodiments, an unutilized space of a display device may be minimized, and a defect of an input sensing unit potentially caused by inflow of external electrostatic discharge may be prevented.

Although embodiments have been described, as examples, various changes may be made without departing from the scope defined by the following claims.

What is claimed is:

1. A display device comprising:
   a first substrate;
   a second substrate overlapping the first substrate and comprising a first surface and a second surface, the first surface and the second surface facing each other;
   a plurality of display elements positioned between the first substrate and the first surface of the second substrate;
   a sealing unit surrounding the display elements in a plan view of the display device and arranged between the first substrate and the first surface of the second substrate;
   a common power supply line at least partially surrounding the display elements in the plan view of the display device and including a protrusion, wherein the protrusion protrudes beyond the sealing unit and is positioned between the sealing unit and a first edge of the first substrate in the plan view of the display device; and
   a conductive member positioned beyond the sealing unit in the plan view of the display device, arranged directly on the second surface of the second substrate, formed of an electrically conductive material, and partially overlapping the protrusion, wherein the second substrate is positioned between the conductive member and the protrusion in a cross-sectional view of the display device.

2. The display device of claim 1, wherein the protrusion includes two edges that are oriented at an acute angle relative to each other in the plan view of the display device and are positioned farther from the sealing unit than the conductive member in the plan view of the display device.

3. The display device of claim 1, wherein the protrusion includes a first pointed portion and a second pointed portion, and wherein an edge of the conductive member is positioned between the first pointed portion and the second pointed portion in a direction parallel to the first edge of the first substrate in the plan view of the display device.

4. The display device of claim 1, wherein the conductive member comprises:
   a first conductive member positioned on the second surface of the second substrate and overlapping the protrusion of the common power supply line; and
   a second conductive member positioned on the second surface of the second substrate, wherein a first section of the sealing unit is positioned between the first conductive member and the second conductive member and abuts the protrusion of the common power supply line in the plan view of the display device.

5. The display device of claim 1, wherein the display elements include a display element, wherein the display element comprises a pixel electrode, a common electrode, and an intermediate layer, wherein the intermediate layer includes an emission layer between the pixel electrode and the common electrode, and wherein the common power supply line is electrically connected to the common electrode.

6. The display device of claim 5 further comprising: a driving power supply line configured to supply driving power to the display element, wherein a first section of the driving power supply line is positioned between the display element and a first section of the sealing unit, and wherein the protrusion of the common power supply line protrudes from and abuts the first section of the sealing unit in the plan view of the display device.

7. The display device of claim 6, wherein a second section of the driving power supply line is positioned closer to the first edge of the first substrate than the protrusion of the common power supply line.

8. The display device of claim 1, further comprising:
   an input sensing unit positioned on the second surface of the second substrate,
   wherein a first section of the sealing unit is positioned between the conductive member and the input sensing unit in the plan view of the display device, and wherein a conductive material of the conductive member is identical to a conductive material of a wiring set of the input sensing unit.

9. The display device of claim 8, wherein the conductive member is positioned between the first section of the sealing unit and the first edge of the first substrate in the plan view of the display device, wherein a second section of the sealing unit extends not aligned with the first section of sealing unit in the plan view of the display device, and wherein a face of the second section of the sealing unit is coplanar with a face of the first substrate.

10. The display device of claim 9, wherein the second section of the sealing unit covers a covered portion of the common power supply line and exposes an exposed portion of the common power supply line, and wherein the covered portion of the common power supply line is positioned between the exposed portion of the common power supply line and the face of the second section of the sealing unit.

11. The display device of claim 1,
    wherein the conductive member is narrower than the protrusion in a direction perpendicular to the first edge of the first substrate.

12. The display device of claim 11, further comprising:
    an input sensing unit positioned directly on the second surface of the second substrate.

13. The display device of claim 11, further comprising:
    a conductive terminal positioned at the first edge of the first substrate, wherein the common power supply line includes a connecting portion directly connected to the conductive terminal, and narrower than the protrusion in a direction parallel to the first edge of the first substrate.

14. The display device of claim 11, wherein a first face of the sealing unit is positioned between the protrusion and a second face of the sealing unit, and wherein the second face of the sealing unit is coplanar with a face of the first substrate.

15. The display device of claim 11, wherein the protrusion includes a first portion and a second portion narrower than the first portion in the direction perpendicular to the first edge of the first substrate, and wherein the conductive member is narrower than each of the first portion and the second portion in the direction perpendicular to the first edge of the first substrate.

16. The display device of claim 1, wherein the protrusion is positioned between a first edge of the second substrate and the sealing unit in the plan view of the display device, and wherein the first edge of the second substrate is positioned between the first edge of the first substrate and the protrusion in the plan view of the display device.

17. A display device comprising:
    a first substrate;
    a second substrate overlapping the first substrate;
    a plurality of display elements positioned between the first substrate and the second substrate;

a sealing unit surrounding the display elements in a plan view of the display device and arranged between the first substrate and the second substrate; and a common power supply line at least partially surrounding the display elements in the plan view of the display device and including a protrusion, wherein the protrusion protrudes beyond the sealing unit and is positioned between the sealing unit and a first edge of the first substrate in the plan view of the display device, and wherein the sealing unit includes:

a first section, wherein the protrusion abuts the first section in the plan view of the display device; and a second section opposite the first section, covering a covered portion of the common power supply line, and exposing an exposed portion of the common power supply line, wherein the exposed portion of the common power supply line is positioned between the covered portion of the common power supply line and the first section of the sealing unit in the plan view of the display device.

18. The display device of claim 17, wherein a face of the second section of the sealing unit is coplanar with each of a face of the second substrate and a face of the first substrate.

19. The display device of claim 18, wherein the protrusion of the common power supply line is positioned between the first section of the sealing unit and an edge of the second substrate in the plan view of the display device.

* * * * *

UNITED STATES PATENT AND TRADEMARK OFFICE
CERTIFICATE OF CORRECTION

PATENT NO. : 11,588,002 B2  
APPLICATION NO. : 16/719862  
DATED : February 21, 2023  
INVENTOR(S) : Younggug Seol et al.

Page 1 of 1

It is certified that error appears in the above-identified patent and that said Letters Patent is hereby corrected as shown below:

On the Title Page

Item (73) should read:  
Assignee: Samsung Display Co., Ltd.

Signed and Sealed this  
Twentieth Day of June, 2023

Katherine Kelly Vidal  
*Director of the United States Patent and Trademark Office*